US010840322B2

(12) United States Patent
Kande et al.

(10) Patent No.: US 10,840,322 B2
(45) Date of Patent: Nov. 17, 2020

(54) THIN FILM RESISTOR AND TOP PLATE OF CAPACITOR SHARING A LAYER

(71) Applicant: Texas Instruments Incorporated, Dallas, TX (US)

(72) Inventors: Dhishan Kande, Dallas, TX (US); Ye Shao, Plano, TX (US); David Curran, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/940,058

(22) Filed: Mar. 29, 2018

(65) Prior Publication Data

US 2019/0305074 A1 Oct. 3, 2019

(51) Int. Cl.
*H01L 49/02* (2006.01)
*H01L 21/033* (2006.01)
*H01L 21/3205* (2006.01)
*H01L 21/3213* (2006.01)
*H01L 21/02* (2006.01)
*H01L 21/311* (2006.01)
(Continued)

(52) U.S. Cl.
CPC .......... *H01L 28/20* (2013.01); *H01L 21/0214* (2013.01); *H01L 21/0217* (2013.01); *H01L 21/0332* (2013.01); *H01L 21/0337* (2013.01); *H01L 21/31116* (2013.01); *H01L 21/32053* (2013.01); *H01L 21/32133* (2013.01); *H01L 21/32139* (2013.01); *H01L 23/5223* (2013.01); *H01L 23/5226* (2013.01); *H01L 23/5228* (2013.01); *H01L 27/0629* (2013.01); *H01L 27/0635* (2013.01); *H01L 28/60* (2013.01)

(58) Field of Classification Search
None
See application file for complete search history.

(56) References Cited

U.S. PATENT DOCUMENTS

| 6,190,933 B1 * | 2/2001 | Shimabukuro ..... G02F 1/13454 438/30 |
| 6,365,480 B1 | 4/2002 | Huppert et al. |
| 8,754,501 B2 | 6/2014 | Khan et al. |

(Continued)

FOREIGN PATENT DOCUMENTS

WO 2017139809 A1 8/2017

OTHER PUBLICATIONS

Patent Cooperation Treaty International Search Report, dated Jul. 4, 2019, PCT/US 2019/024505.

*Primary Examiner* — Anthony Ho
*Assistant Examiner* — Kevin Quinto
(74) *Attorney, Agent, or Firm* — Jacqueline J. Garner; Charles A. Brill; Frank D. Cimino

(57) ABSTRACT

An integrated circuit (IC) includes a substrate with a semiconductor surface layer including functional circuitry having a plurality of interconnected transistors including a dielectric layer thereon with a metal stack including a plurality of metal levels over the dielectric layer. A thin film resistor (TFR) layer including at least one metal is within the metal stack. At least one capacitor is within the metal stack including a capacitor dielectric layer over a metal bottom plate formed from one of the metal levels. The capacitor top plate is formed from the TFR layer on the capacitor dielectric layer and there is at least one resistor lateral to the capacitor formed from the same TFR layer.

22 Claims, 6 Drawing Sheets

(51) Int. Cl.
    *H01L 27/06*     (2006.01)
    *H01L 23/522*     (2006.01)

(56) References Cited

U.S. PATENT DOCUMENTS

| | | | |
|---|---|---|---|
| 9,064,719 B1* | 6/2015 | Zhou | H01L 27/0688 |
| 2001/0036101 A1* | 11/2001 | Schlosser | G11C 11/22 |
| | | | 365/145 |
| 2004/0018739 A1* | 1/2004 | Abooameri | H01L 21/32137 |
| | | | 438/709 |
| 2004/0121266 A1* | 6/2004 | Lee | H05K 1/162 |
| | | | 430/313 |
| 2014/0239449 A1* | 8/2014 | Dirnecker | H01L 28/20 |
| | | | 257/536 |
| 2015/0108607 A1 | 4/2015 | Chen et al. | |
| 2016/0020205 A1* | 1/2016 | Song | H01L 27/0629 |
| | | | 257/379 |
| 2016/0049461 A1 | 2/2016 | Magnee et al. | |

\* cited by examiner

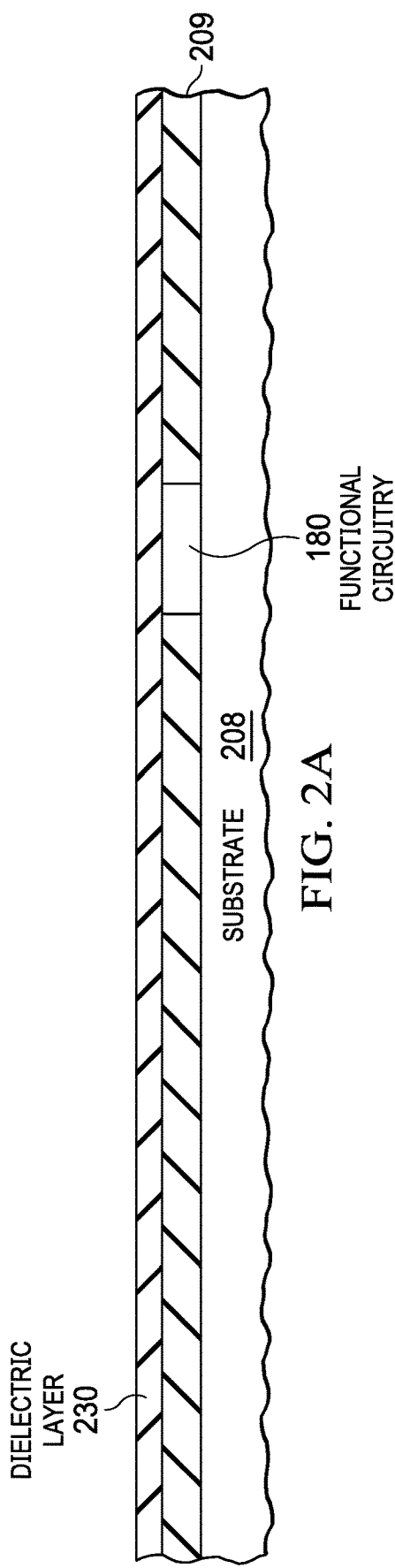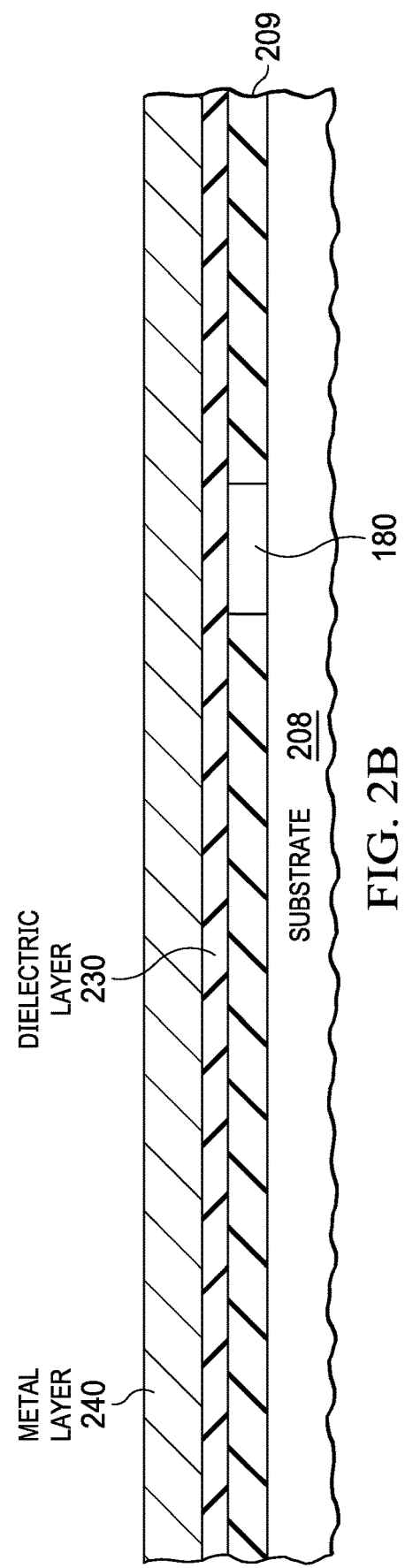

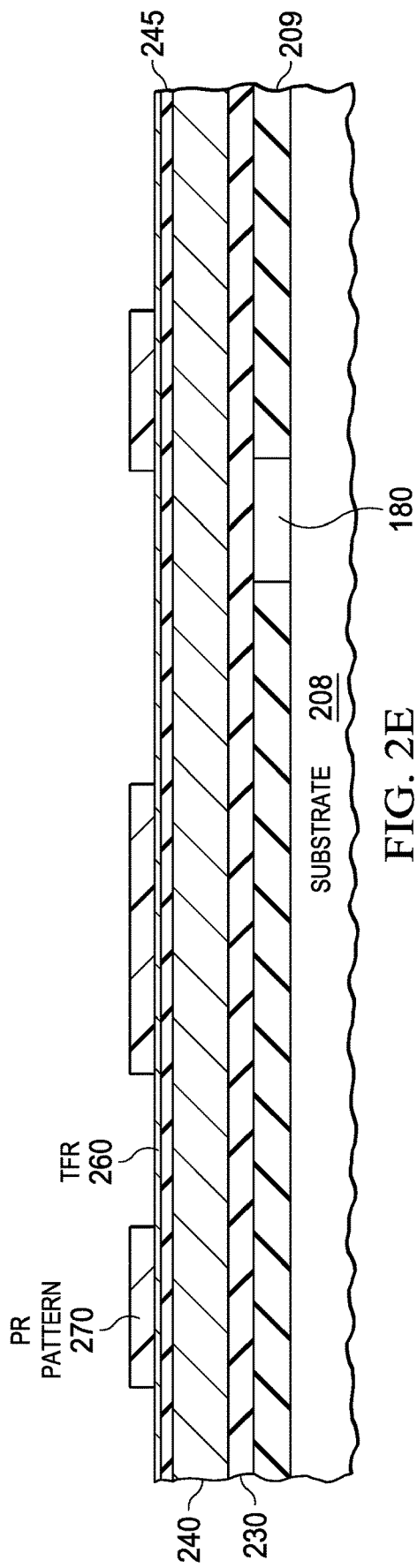
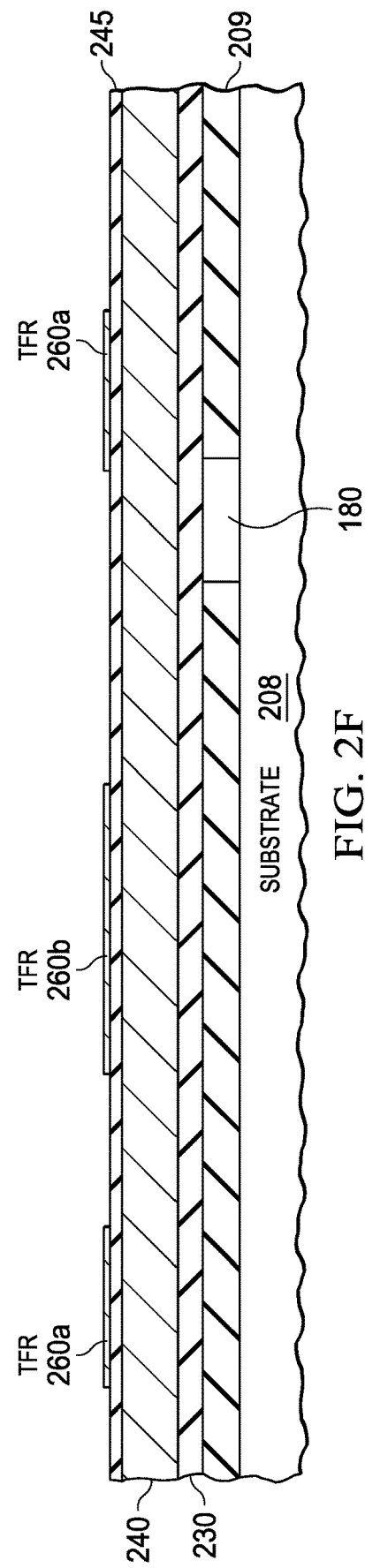
FIG. 2E
FIG. 2F

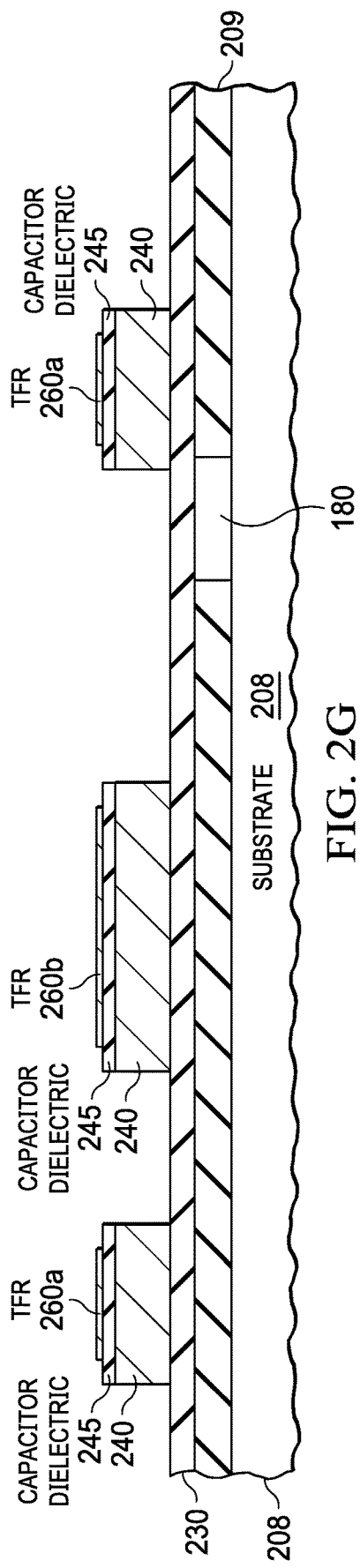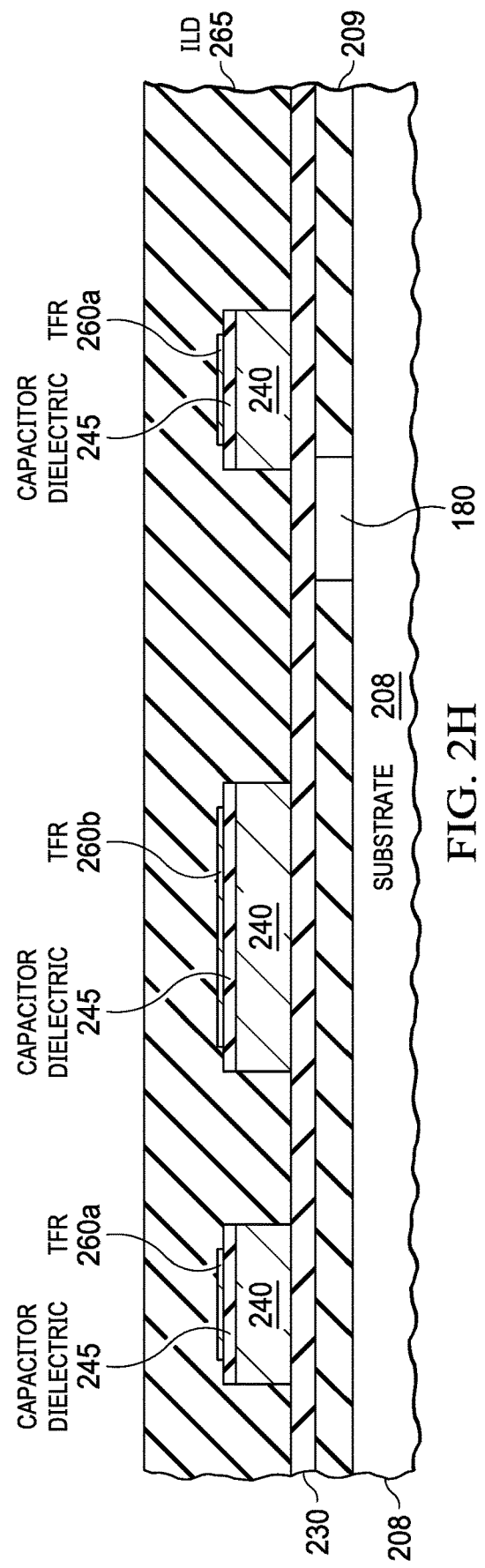

US 10,840,322 B2

THIN FILM RESISTOR AND TOP PLATE OF CAPACITOR SHARING A LAYER

FIELD

This Disclosure relates to processing of integrated circuit (IC) devices having thin film resistors and capacitors both within the metal stack, and such ICs therefrom.

BACKGROUND

Some IC devices include thin film resistors (TFRs). Silicon chromium (SiCr) has been used for years for TFRs due to its high electrical resistance in thin film form, relatively low temperature coefficient of resistance (TCR), and the ability to carry relatively high current densities. The TFRs are formed in backend of the line (BEOL) processing within the metal stack (e.g., between Metal 1 (M1) and M2, or between M2 and M3) over functional circuitry formed in front of the line (FEOL) processing the semiconductor surface layer below. Such IC devices may also include capacitors within the metal stack known as metal-insulator-metal (MIM) capacitors.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a method of fabricating IC devices having thin film resistors and capacitors both within the metal stack. At least one dielectric layer is deposited on a semiconductor surface layer on a substrate having a plurality the IC die formed in the semiconductor surface layer, with each IC die including functional circuitry comprising a plurality of interconnected transistors. A metal layer is formed over the dielectric layer for a bottom plate for a MIM capacitor defined herein to have respective plates separated by a capacitor dielectric layer(s) each plate comprising at least one metal.

At least one capacitor dielectric layer is deposited on the metal layer. A TFR layer comprising at least one metal is deposited on the capacitor dielectric layer. A pattern is formed on the TFR layer. The TFR layer is etched using the pattern including defining a top plate comprising the TFR layer on the capacitor dielectric layer and to define a TFR layer portion lateral to the MIM capacitor to form a resistor comprising the TFR layer (referred to herein as a 'TFR'). A pattern is formed on the capacitor dielectric layer, the capacitor dielectric layer is etched, and the metal layer is then etched to define the bottom plate to complete the MIM capacitor.

BRIEF DESCRIPTION OF THE DRAWINGS

Reference will now be made to the accompanying drawings, which are not necessarily drawn to scale, wherein:

FIGS. 2A-2I are cross-sectional diagrams showing processing progression for an example method of forming an IC having at least one TFR and at least one MIM capacitor, where the same TFR layer is used as to form the TFR and for the top plate of the MIM capacitor, according to an example aspect.

DETAILED DESCRIPTION

Figure 1:
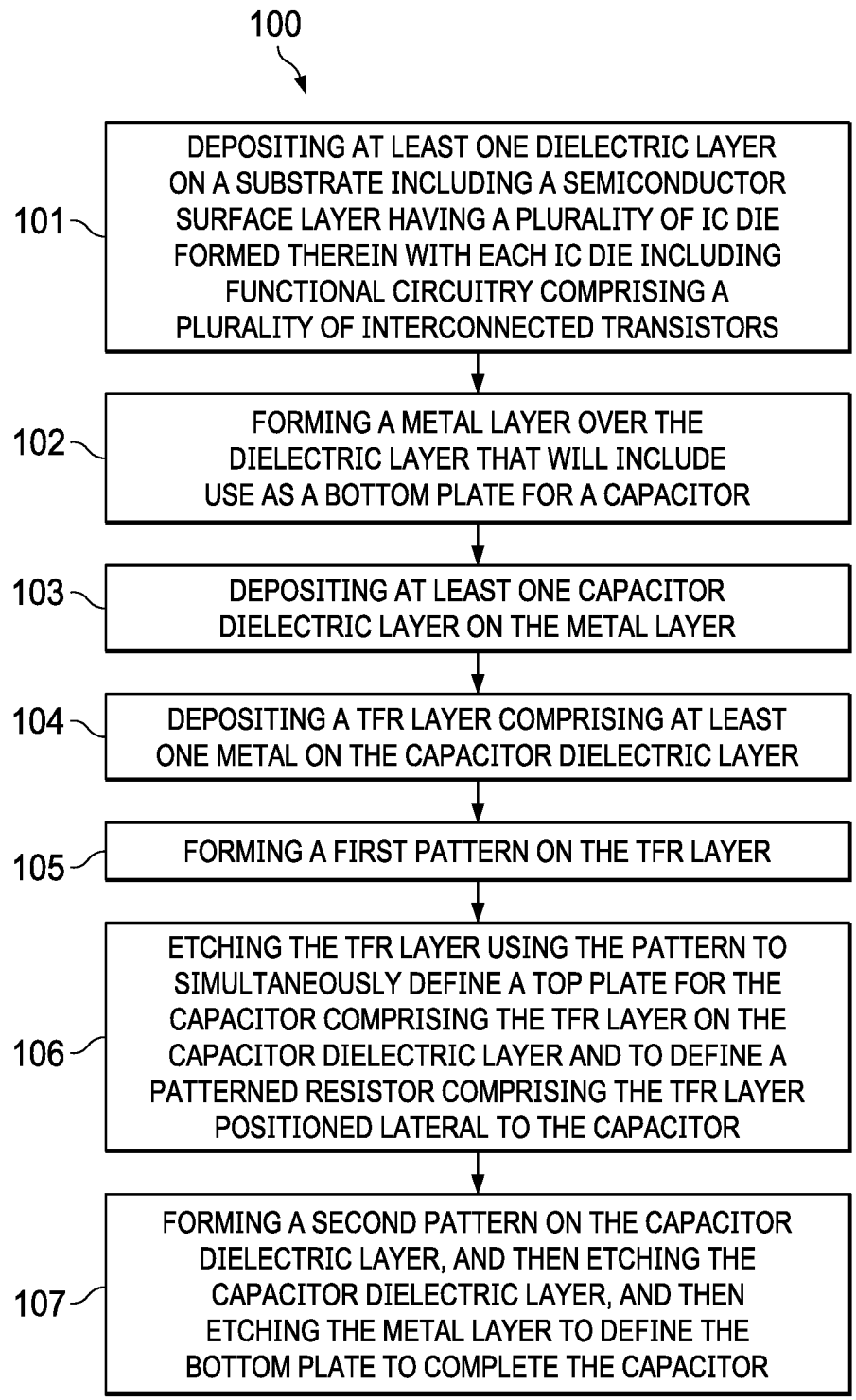
FIG. 1 is a flow chart that shows steps in an example method of fabricating ICs including at least one TFR and at least one MIM capacitor, where the same TFR layer is used at a single mask level to form the TFR and also to form a top plate for the MIM capacitor, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a flow chart that shows steps in an example method 100 of fabricating ICs including at least TFR and at least one MIM capacitor, where the same TFR layer is used at a single mask level to form the TFR and also to form a top plate of the MIM capacitor, according to an example aspect. Step 101 comprises depositing at least one dielectric layer on a substrate (e.g., a wafer) including a semiconductor surface layer having a plurality of IC die formed therein with each IC die including functional circuitry comprising a plurality of interconnected transistors. The substrate can comprise a bulk substrate material such as silicon, or an epitaxial layer on a bulk substrate material (see substrate 208 with semiconductor surface layer 209, with functional circuitry 180 formed in the semiconductor surface layer 209 in FIGS. 2A-2I). Alternatively, the substrate can comprise silicon-germanium, other Group 4 material, or other semiconductor materials including III-V and II-VI compound semiconductor materials.

Functional circuitry as used herein realizes and carries out a desired functionality, such as that of a digital IC (e.g., digital signal processor) or analog IC (e.g., amplifier or power converter), and in one aspect a BiCMOS (MOS and Bipolar) IC. The capability of functional circuitry provided on a disclosed IC may vary, for example ranging from a simple device to a complex device. The specific functionality contained within functional circuitry is not of importance to disclosed ICs. The functional circuitry (see functional circuitry 180 in FIGS. 2A-2I described below) is generally formed in the substrate before forming the TFRs described below.

FIG. 2A shows an in-process IC die after step 101 showing a dielectric layer 230 on a semiconductor surface layer 209 on a substrate 208 that has a plurality of IC die formed in the semiconductor surface layer 209 with the IC die including functional circuitry 180 comprising a plurality of interconnected transistors. The dielectric layer 230 electrically isolates FEOL components on the IC from its BEOL interconnections and components.

The dielectric layer 230 shown in FIGS. 2A-2I is a pre-metal dielectric (PMD) layer so that the bottom plate of the MIM capacitor is described in FIGS. 2A-2I as being metal 1 (M1). However, the dielectric layer directly under the bottom plate of the MIM capacitor can also be an inter level dielectric (ILD) layer so that the bottom plate of the MIM capacitor can also be M2, M3, or up to the top M layer–1 M layer. The dielectric layer 230 can comprise a tetraethoxysilane (TEOS)-derived silicon oxide layer. A TEOS deposition for a non-plasma deposition process can comprise low pressure CVD (LPCVD) at a pressure of about 300 mTorr and at a temperature of about 700° C. However, other dielectric layers can also be used including deposited silicon oxides, such as comprising an organosilicate glass (OSG), a low-k dielectric (i.e., a smaller dielectric constant relative to silicon dioxide), a doped dielectric layer such as a fluorine-doped silica glass (FSG), or a SiN layer or its variants (e.g., SiON). The thickness range for the dielectric layer 230 is generally from 6,000 A to 8,000 A for a PMD layer and 1.0 to 1.4 µm for an ILD layer.

Figure 2C:
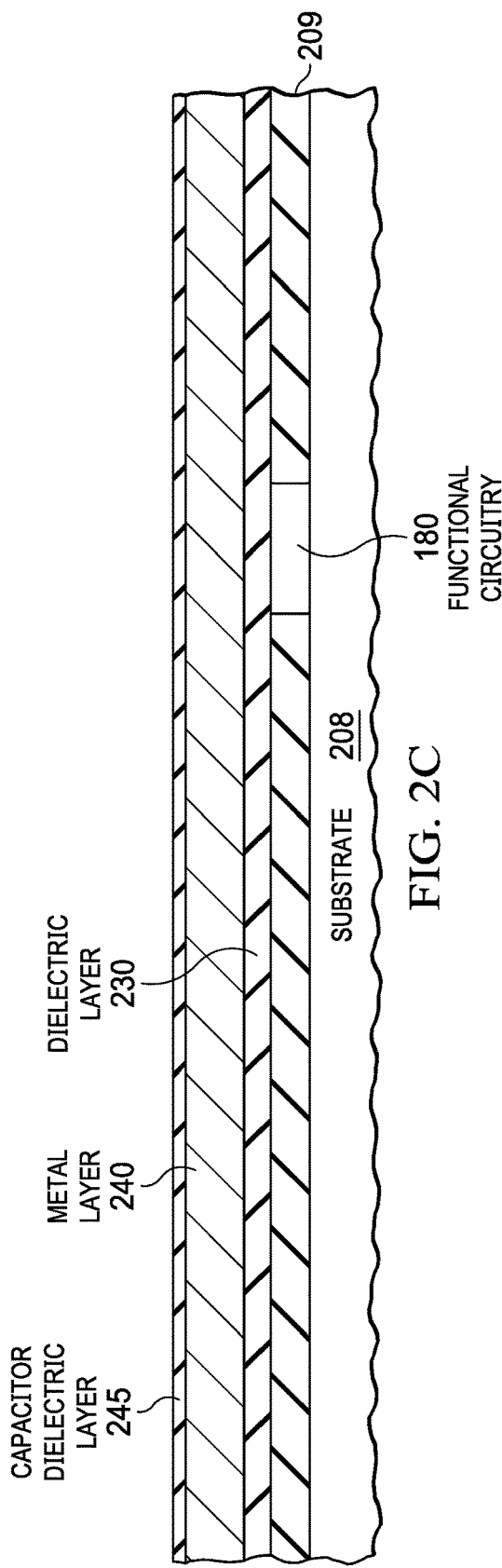

Step 102 comprises forming a metal layer 240 over the dielectric layer 230 that will include use as a bottom plate for a capacitor. FIG. 2B shows the in-process IC die after step 102 showing the metal layer 240 over the dielectric layer 230. The metal layer 240 can comprise AlCu, typically with 0.5 to 4 wt. % copper. Alternatively, the metal layer 240 can comprise only copper in which case a damascene process is generally performed (a damascene process is not shown in FIGS. 2A-2I).

Step 103 comprises depositing at least one capacitor dielectric layer 245 on the metal layer 240. FIG. 2C shows the in-process IC die after step 103 showing at least one capacitor dielectric layer 245 on the metal layer 240. The thickness of the capacitor dielectric layer(s) is generally 200 A to 2,000 A, and can be a single layer or comprise 2 or more layers. The dielectric stack can include at least one silicon nitride layer. In one embodiment the capacitor dielectric layer 245 comprises a silicon oxide-silicon nitride (SiN)-silicon oxide (ONO) stack, where the ONO stack can function as an anti-reflectance coating (ARC) for the below-described bottom metal plate photolithography and patterning.

Figure 2D:
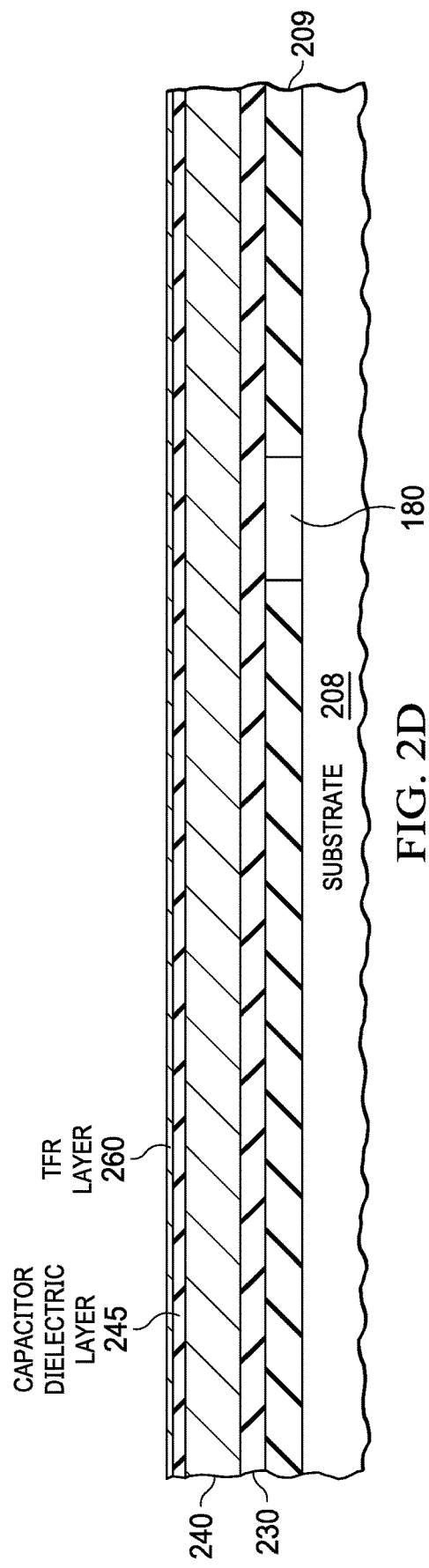

Step 104 comprises depositing a TFR layer comprising at least one metal on the capacitor dielectric layer 245. The TFR layer deposition process can comprise a direct current (DC) or radio frequency (RF) sputtering process. FIG. 2D shows the in-process IC die after step 104 showing the TFR layer 260 on the capacitor dielectric layer 245. The TFR layer 260 can comprise SiCr or its alloys such as carbon containing including SiCCr, SiCOCr where C can be 1 atomic % to 50 atomic %, or NiCr or its alloys such as NiCrFe 61% Ni, 15% Cr, 24% Fe (all atomic %'s). The thickness of the TFR layer 260 is generally 10 nm to 100 nm, such as 25 nm to 35 nm thick, or about 30 nm thick in one specific aspect.

Step 105 comprises forming a first pattern on the TFR layer 260. FIG. 2E shows the in-process IC die after forming a pattern shown as a photoresist (PR) pattern 270 on the TFR layer 260. Step 106 comprises etching the TFR layer 260 using the PR pattern 270 to simultaneously define a top plate for the capacitors comprising the TFR layer shown as TFR portion 260a on the capacitor dielectric layer 245 and to define a patterned resistor comprising the TFR layer shown as TFR portion 260b positioned lateral to the capacitors. FIG. 2F shows the in-process IC die after etching the TFR layer 260. The etch gases used for plasma etching the TFR layer 260 generally include flowing $O_2$, $Cl_2$, and at least one carbon-halogen gas. For example, $O_2$, $Cl_2$, and $CF_4$ with optional Ar may be used for etching SiCr. In addition other gasses may also be used for etching the TFR layer 260 such as $CHF_3$, OR $CH_2F_2$ as a replacement for or in addition to $CF_4$, and/or $N_2$ used as well.

Step 107 comprises forming a second pattern on the capacitor dielectric layer 245 and then etching the capacitor dielectric layer 245 and the metal layer 240 to define the bottom plate to complete the MIM capacitor. For this patterning the capacitor dielectric layer 245 can act as an anti-reflection coating (ARC), particularly when it includes silicon nitride or silicon oxynitride. The metal wiring needed for connections to the functional circuitry 180 is also generally defined as well in the step 107 etching of the metal layer 240.

FIG. 2G shows the in-process IC die after etching the capacitor dielectric layer 245 and the metal layer 240 thereunder to define the bottom plate to complete the MIM capacitor. The pattern used for step 107 provides a larger area for defining the capacitor dielectric layer 245 and the metal layer 240 for the MIM capacitor as compared to the area of the TFR portion 260a for the MIM capacitor (after step 106, TFR layer etching) to provide locations to place a via (shown as via lands 278 below) for contacting the bottom plate of the MIM capacitor comprising metal layer 240.

Optionally a hardmask/etch stop layer can be deposited on the TFR layer 260 before its patterning (before step 105). The hardmask/etch stop layer can comprise a LPCVD process at a pressure of about 300 mTorr and at a temperature of about 700° C. for a TEOS-based deposition. The hardmask/etch stop layer thickness range can be 50 A to 1,500 A. Such a hardmask/etch stop layer may not be needed if the TFR etching process includes essentially no over etch of the TFR layer 260. A top silicon oxide layer in an ONO stack for the capacitor dielectric layer 245 may work as an etch stop for the TFR layer 260.

Figure 2I:
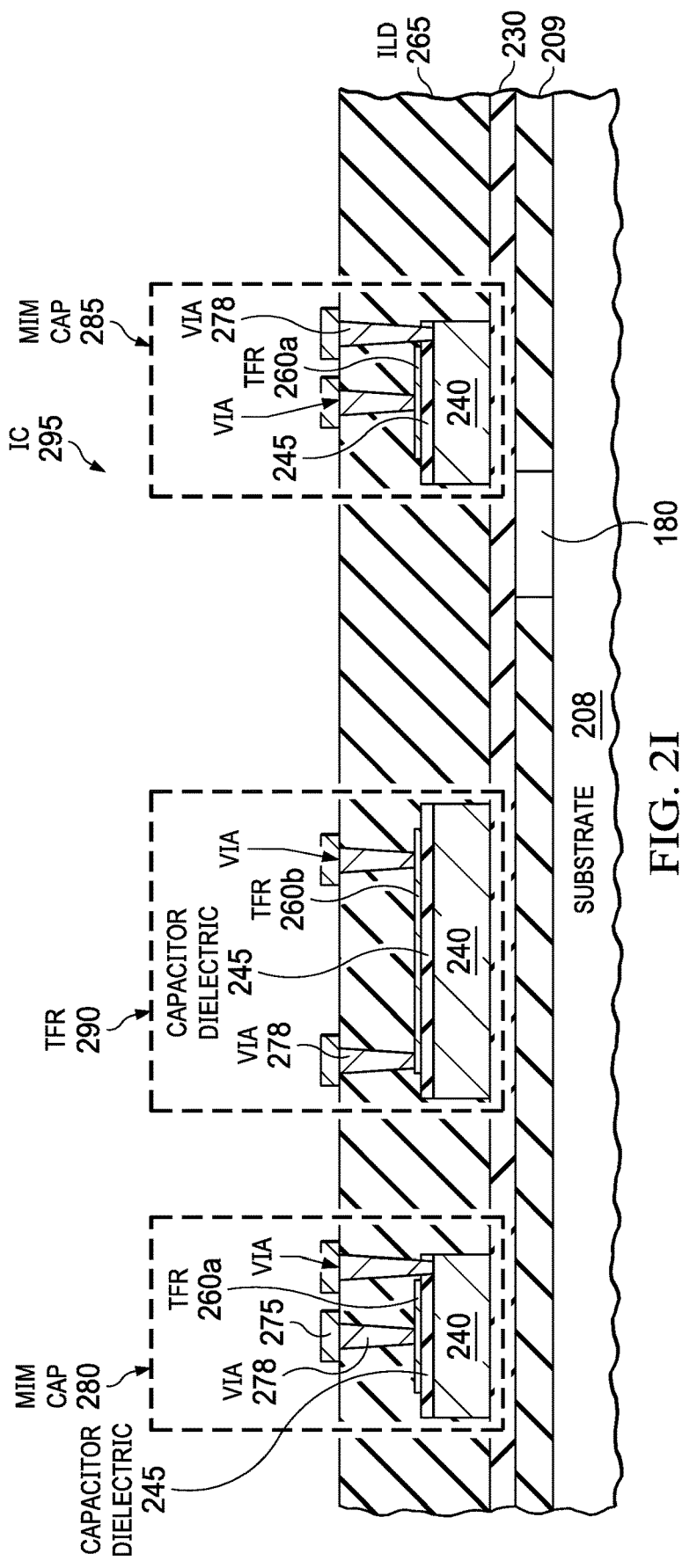

FIG. 2H shows the in-process IC die after depositing an ILD layer shown as ILD layer 265 then planarizing the wafer surface, such as using chemical mechanical polishing (CMP). FIG. 2I shows the in-process IC die after etching vias in the ILD layer 265 and then filling the vias with an electrically conductive material (such as W) to form vias lands 278. Shown in FIG. 2I on the IC 295 are a MIM capacitor 280, a MIM capacitor 285, and TFR 290 comprising a TFR portion 260b, with a patterned metal layer 275 over the via lands 278. Although not shown, the MIM capacitors 280, 285 and the TFR 290 are connected to nodes within the functional circuitry 180. Because the TFR layer 260 and capacitor dielectric layer 245 are generally both thin, a single contact process can be used to contact both the bottom plate of the MIM capacitors 280, 285 and the TFR 290 comprising the TFR layer. This is because of a height difference for via etch in the capacitor region versus standard metal 1 circuitry is small. This may also eliminate the need to have a hardmask layer over the TFR layer.

The wafer processing can then then be completed by conventional BEOL processing comprising forming one or more additional metal levels thereon including a top metal level. The top metal layer can comprise aluminum (or an aluminum alloy) or copper. Passivation overcoat (PO) then generally follows, followed by patterning the PO. The PO layer comprises at least one dielectric layer such as silicon oxide, silicon nitride, or SiON.

Advantages of disclosed processing include:
1. Allows the contact to the MIM capacitor(s) and the resistor comprising the TFR layer to be provided in the same mask level.
2. Eliminates the cost of 1 mask and added cycle time by using the TFR layer as the top plate of the MIM capacitor.

3. Allows thinning of the TFR layer to provide a higher sheet resistance available to IC designers.
4. Allow thinning or the elimination of a via etch stop layer on top of the TFR layer.
5. Improves the process window for metal (capacitor bottom plate and interconnect) patterning.
6. Eliminates or significantly reduces unexpected parasitic capacitor as compared to a MIM capacitor having a TiN top plate caused by post-etch TiN notches.
7. Provides relaxation of keep out zone design rules and spacing rules between metal lines which will benefit IC designers because of a thinner top plate for the MIM capacitors as compared to MIM capacitors with a thicker top plate material such TiN, and etch selectivity for the top plate material such as when the TFR layer is a chromium alloy (e.g., SiCr) relaxing the spacing rules between metal lines.

EXAMPLES

Disclosed aspects are further illustrated by the following specific Examples, which should not be construed as limiting the scope or content of this Disclosure in any way.

For a current baseline BEOL process for forming a MIM capacitor with a TiN top plate, the top plate thickness was found to have an 85% variation across a wafer. For disclosed processing forming the MIM capacitor's top plate from the TFR layer, the top plate thickness had only a 12% variation across a wafer. TiN and TFR resistor segments with different width to length (W/L) combinations were tested and sheet resistances were extracted for each die location on the wafer. Sheet resistance variation was evaluated as 6-sigma of the sheet resistance divided by mean. The sheet resistance was directly translated to thickness variation. Cross sectional images of the capacitors were also collected to validate these measurements.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other aspects are possible within the scope of the claimed invention, and further additions, deletions, substitutions and modifications may be made to the described aspects without departing from the scope of this disclosure.

The invention claimed is:

1. A method of fabricating integrated circuits (ICs), comprising:
depositing a dielectric layer on a semiconductor surface layer on a substrate having a plurality of IC die formed in said semiconductor surface layer with each said IC die including functional circuitry comprising a plurality of interconnected transistors;
forming a metal layer of a metal level over said dielectric layer including for a bottom plate for a capacitor;
depositing at least one capacitor dielectric layer on said metal layer;
depositing a thin film resistor (TFR) layer comprising at least one metal on said capacitor dielectric layer;
forming a first pattern on said TFR layer;
etching said TFR layer using said first pattern including defining a top plate comprising said TFR layer on said capacitor dielectric layer and defining said TFR layer lateral to said capacitor form a resistor comprising said TFR layer, and
forming a second pattern on said capacitor dielectric layer, etching said capacitor dielectric layer, and then etching said metal layer to define said bottom plate and to complete said capacitor.

2. The method of claim 1, wherein said etching said capacitor dielectric layer and etching said metal layer both utilize said pattern on said capacitor dielectric layer.

3. The method of claim 1, wherein the metal level is metal level M1.

4. The method of claim 1, wherein said metal for said TFR layer comprises chromium (Cr).

5. The method of claim 4, wherein said TFR layer comprises silicon chromium (SiCr).

6. The method of claim 5, wherein said SiCr layer further comprises carbon.

7. The method of claim 1, wherein said TFR layer is 10 nm to 100 nm thick.

8. The method of claim 7, wherein said TFR layer 25 nm to 35 nm thick.

9. The method of claim 1, further comprising before said etching said TFR layer depositing a hardmask layer on said TFR layer.

10. The method of claim 9, wherein said depositing said hardmask layer comprises utilizing tetraethoxysilane (TEOS) as a precursor material.

11. The method of claim 1, wherein said capacitor dielectric layer is 200 A to 2,000 A thick and comprises at least two dielectric layers.

12. The method of claim 11, wherein said at least two dielectric layers include a silicon nitride or a silicon oxynitride layer.

13. An integrated circuit (IC), comprising:
a substrate that includes a semiconductor surface layer including functional circuitry comprising a plurality of interconnected transistors including a dielectric layer thereon with a metal stack including a plurality of metal levels over said dielectric layer;
a thin film resistor (TFR) layer comprising at least one metal within said metal stack;
at least one capacitor within said metal stack including a capacitor dielectric layer over a metal bottom plate formed from one of said plurality of metal levels, and a top plate for said capacitor comprising said TFR layer on said capacitor dielectric layer and at least one resistor lateral to said capacitor comprising said TFR layer; and
a hardmask layer over the TFR layer.

14. The IC of claim 13, wherein said dielectric layer comprises a pre-metal dielectric (PMD) layer.

15. The IC of claim 13, wherein the hardmask layer comprises silicon oxide.

16. The IC of claim 13, wherein said metal for said TFR layer comprises chromium (Cr).

17. The IC of claim 16, wherein said TFR layer comprises silicon chromium (SiCr).

18. The IC of claim 17, wherein said SiCr layer further comprises carbon.

19. The IC of claim 13, wherein a thickness of said TFR layer is 10 nm to 100 nm.

20. The IC of claim 19, wherein said thickness of said TFR layer is 25 nm to 35 nm.

21. The IC of claim 13, wherein said capacitor dielectric layer is 200 A to 2,000 A thick and comprises at least two dielectric layers.

22. The IC of claim 21, wherein said at least two dielectric layers include a silicon nitride or a silicon oxynitride layer.

* * * * *